(12) United States Patent
Hara et al.

(10) Patent No.: US 12,019,100 B2
(45) Date of Patent: Jun. 25, 2024

(54) SHUNT RESISTOR MODULE

(71) Applicant: KOA CORPORATION, Nagano (JP)

(72) Inventors: Kazuhiro Hara, Nagano (JP); Tamotsu Endo, Nagano (JP)

(73) Assignee: KOA CORPORATION, Nagano (JP)

( * ) Notice: Subject to any disclaimer, the term of this patent is extended or adjusted under 35 U.S.C. 154(b) by 200 days.

(21) Appl. No.: 17/766,297

(22) PCT Filed: Sep. 30, 2020

(86) PCT No.: PCT/JP2020/037302
§ 371 (c)(1),
(2) Date: Apr. 4, 2022

(87) PCT Pub. No.: WO2021/070716
PCT Pub. Date: Apr. 15, 2021

(65) Prior Publication Data
US 2023/0015342 A1   Jan. 19, 2023

(30) Foreign Application Priority Data

Oct. 11, 2019  (JP) ................................. 2019-187875

(51) Int. Cl.
*H02H 3/087* (2006.01)
*G01R 15/14* (2006.01)
*H01C 13/02* (2006.01)

(52) U.S. Cl.
CPC ........... *G01R 15/146* (2013.01); *H01C 13/02* (2013.01)

(58) Field of Classification Search
CPC ............................. H01C 13/02; G01R 15/146
See application file for complete search history.

(56) References Cited

U.S. PATENT DOCUMENTS

| 2013/0314827 A1* | 11/2013 | Sohn ...................... H02H 3/087 |
| | | 361/57 |
| 2015/0048923 A1 | 2/2015 | Kameko et al. |
| 2016/0146900 A1* | 5/2016 | Yu ........................ G01R 31/364 |
| | | 324/437 |
| 2017/0003322 A1* | 1/2017 | Nakamura ........... G01R 15/146 |

FOREIGN PATENT DOCUMENTS

JP    2013-201339 A   10/2013

OTHER PUBLICATIONS

International Search Report issued in International Bureau of WIPO Patent Application No. PCT/JP2020/037302, dated Dec. 22, 2020, along with an English translation thereof.

* cited by examiner

*Primary Examiner* — Alesa Allgood
(74) *Attorney, Agent, or Firm* — GREENBLUM & BERNSTEIN, P.L.C.

(57) ABSTRACT

An object is to provide a shunt resistor module that is reduced in size, can handle a large current, and can accurately detect current. A shunt resistor module of the present invention includes: a shunt resistor that includes a plurality of resistor bodies having a columnar shape, and electrodes that are located at both ends of each of the plurality of resistor bodies; and a circuit board that includes a plurality of through-holes that can house the plurality of resistor bodies, and a plurality of voltage detection terminals that detects a voltage between the electrodes of the shunt resistor that has been inserted into the plurality of through-holes, and each of the plurality of voltage detection terminals is collected near a center of gravity of the shunt resistor.

5 Claims, 13 Drawing Sheets

SHUNT RESISTOR MODULE

TECHNICAL FIELD

The present invention relates to a shunt resistor module including a shunt resistor.

BACKGROUND ART

A shunt resistor is used, for example, to detect a current of a power semiconductor device or the like.

As the shunt resistor, a surface mounting type, as described in Patent Literature 1, or a plate-shaped structure is known.

CITATION LIST

Patent Literature

Patent Literature 1: JP 2013-201339 A

SUMMARY OF INVENTION

Technical Problem

For the high-voltage purpose (current detection) of the power semiconductor device or the like, it is requested that the shunt resistor have a structure that handles a large current, and this causes problems of an increase in size of the shunt resistor and an increase in a mounting area relative to a circuit board.

Accordingly, the present invention has been made in view of the problems described above, and it is an object of the present invention to provide a shunt resistor module that is reduced in size, can handle a large current, and can accurately detect current.

Solution to Problem

A shunt resistor module in an aspect of the present invention includes: a shunt resistor that includes a plurality of resistor bodies having a columnar shape, and electrodes that are located at both ends of each of the plurality of resistor bodies; and a circuit board that includes a plurality of through-holes that can house the plurality of resistor bodies, and a plurality of voltage detection terminals that detects a voltage between the electrodes of the shunt resistor that has been inserted into the plurality of through-holes, and each of the plurality of voltage detection terminals is collected near a center of gravity of the shunt resistor.

Advantageous Effects of Invention

In a shunt resistor module of the present invention, a plurality of resistor bodies that configures a shunt resistor and has a columnar shape is housed in respective through-holes that have been installed in a circuit board, and a plurality of voltage detection terminals is collected near the center of gravity of the shunt resistor. This enables a structure that is reduced in size and can handle a large current, and enables a reduction in an influence on the voltage detection terminals of a magnetic flux that is generated when current flows through the shunt resistor. Thus, current can be accurately detected.

DESCRIPTION OF EMBODIMENTS

A shunt resistor module according to an embodiment of the present invention is described below with reference to the accompanying drawings.

As a result of earnest studies, the inventors of the present invention have made a change from a configuration in which a shunt resistor is disposed in a plane on a circuit board to a configuration in which the shunt resistor is inserted into the circuit board in order to handle a large current, and have developed the present invention in order to reduce an influence on a voltage detection terminal of a magnetic flux that is generated when current flows through the shunt resistor.

Stated another way, a shunt resistor module according to an embodiment of the present invention includes:

(1) a shunt resistor that includes a plurality of resistor bodies having a columnar shape, and electrodes that are located at both ends of each of the plurality of resistor bodies; and (2) a circuit board that includes a plurality of through-holes that can house the plurality of resistor bodies, and a plurality of voltage detection terminals that detects a voltage between the electrodes of the shunt resistor that has been inserted into the plurality of through-holes, in which (3) each of the plurality of voltage detection terminals is collected near a center of gravity of the shunt resistor.

A structure of a shunt resistor module 1 according to a first embodiment is described below.

Shunt Resistor Module 1 According to First Embodiment

Figure 1A:
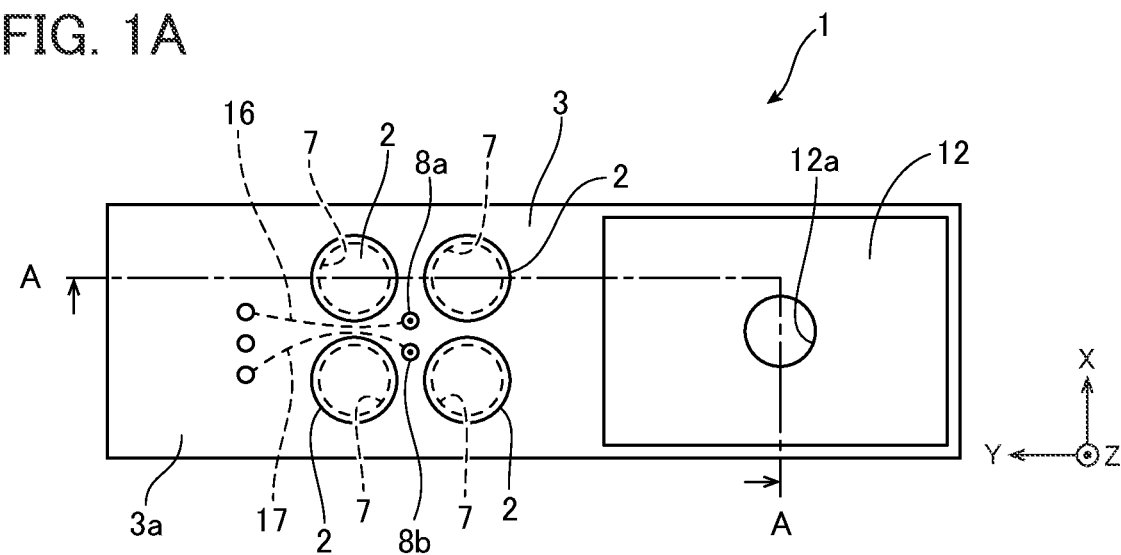
FIG. 1A is a plan view of a shunt resistor module according to a first embodiment.
Figure 1B:
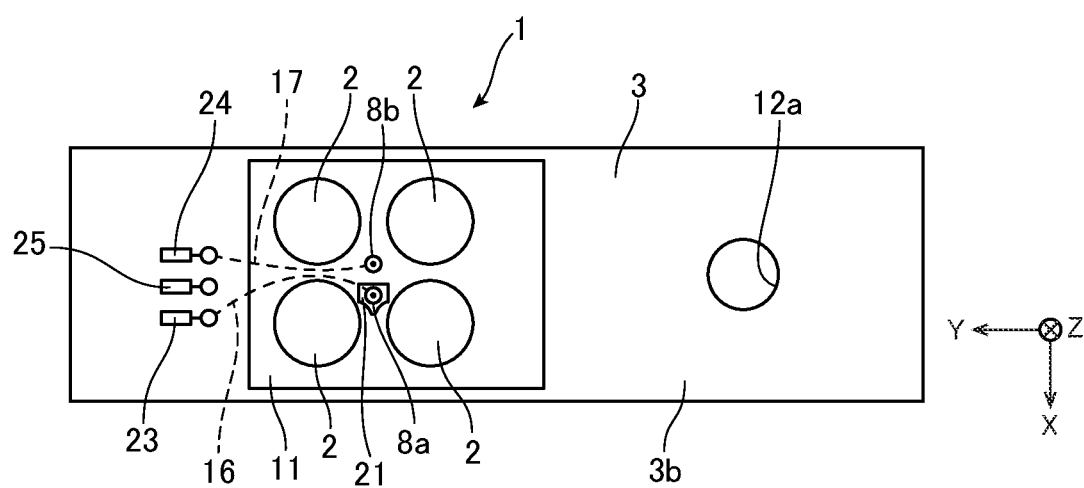
FIG. 1B is a reverse surface view of the shunt resistor module according to the first embodiment.
Figure 2:
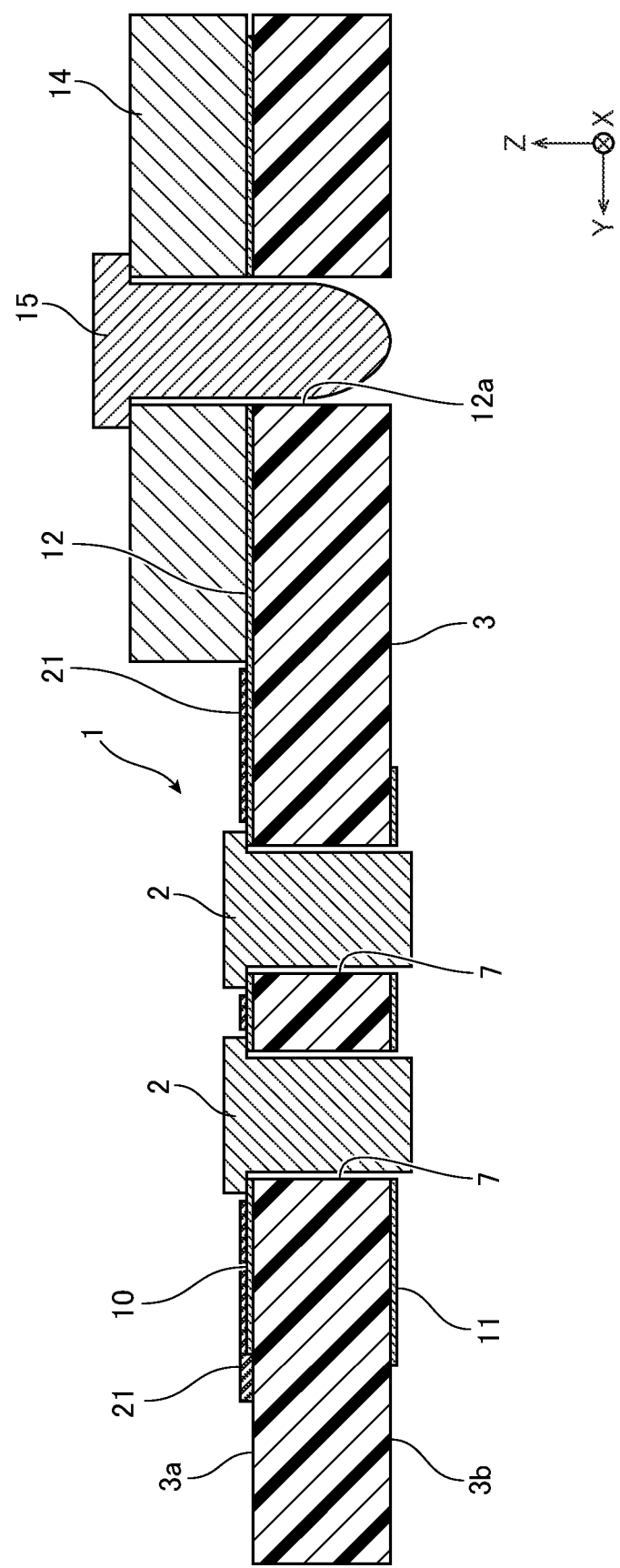
FIG. 2 is a sectional view of the shunt resistor module that has been cut along line A-A of FIG. 1A, and is a sectional view when viewed in the direction indicated by arrows.
Figure 3A:
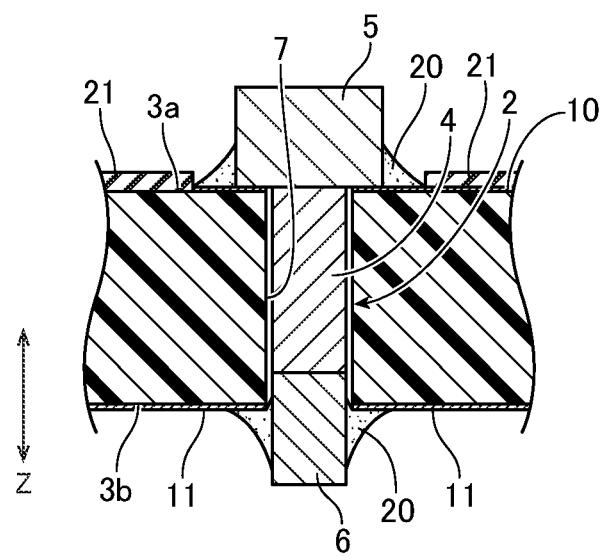
FIG. 3A is a partially enlarged sectional view illustrating a shunt resistor that has been inserted into a circuit board.
Figure 3B:
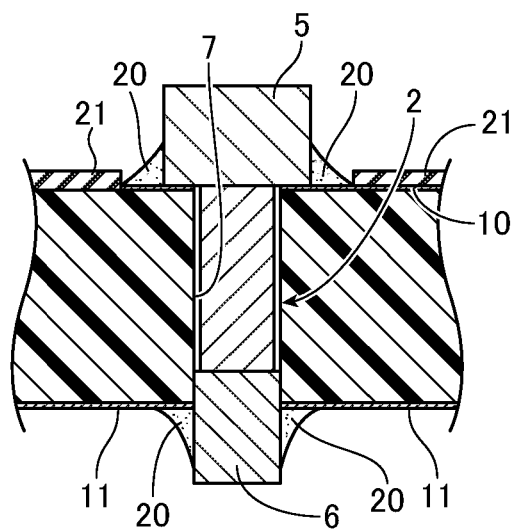
FIG. 3B is a partially enlarged sectional view illustrating a shunt resistor that has been inserted into a circuit board.

FIG. 1A is a plan view of a shunt resistor module according to the first embodiment, and FIG. 1B is a reverse surface view of the shunt resistor module according to the first embodiment. FIG. 2 is a sectional view of the shunt resistor module that has been cut along line A-A of FIG. 1A, and is a sectional view when viewed in the direction indicated by arrows. FIGS. 3A and 3B are partially enlarged sectional views illustrating a shunt resistor that has been inserted into a circuit board.

As illustrated in FIGS. 1A, 1B, and 2, the shunt resistor module 1 includes a plurality of shunt resistors 2 and a circuit board 3 that supports a resistor body 4 of the shunt resistor 2 to be able to house the resistor body 4.

Shunt Resistor 2

As illustrated in FIGS. 3A and 3B, the shunt resistor 2 is formed to have a columnar shape (a bar shape) having height in a height direction (a Z-direction), for example, a cylindrical shape.

The shunt resistor 2 includes the resistor body 4 having a columnar shape, and a first electrode 5 and a second electrode 6 that are disposed at both an upper end and a lower end of the resistor body 4. The first electrode 5 and the second electrode 6 have an electric resistance value that is lower than an electric resistance value of the resistor body 4. Material is not limited, but for example, the resistor body 4 is metal such as Cu—Ni based metal, Cu—Mn based metal, or Ni—Cr based metal, and the electrode 5 or 6 is metal such as Cu. In FIG. 3A, a diameter of the first electrode 5 that is located at the upper end of the resistor body 4 is larger than a diameter of the resistor body 4, and is larger than a diameter of a through-hole 7 that has been formed in the circuit board 3. In addition, in FIG. 3A, a diameter of the second electrode 6 that is located at the lower end of the resistor body 4 is roughly the same as the diameter of the resistor body 4. As described above, the diameter of the first electrode 5 is larger than the diameter of the through-hole 7 of the circuit board 3. Therefore, when the shunt resistor 2 is inserted into the through-hole 7 of the circuit board 3, the first electrode 5 is caught on a front surface 3a of the circuit board 3, and serves as a retainer. As illustrated in FIG. 3A, the first electrode 5 of the shunt resistor 2 is electrically connected to a front-surface conductive part 10 formed on the front surface 3a of the circuit board 3 with a solder layer 20 interposed therebetween. In addition, the second electrode 6 of the shunt resistor 2 is electrically connected to a reverse-surface conductive part 11 formed on a reverse surface 3b of the circuit board 3 with the solder layer 20 interposed therebetween. As illustrated in FIG. 3A, the resistor body 4 is housed in the through-hole 7.

In FIG. 3A, even in a case where there is a slight gap between the second electrode 6 and the through-hole 7 of the circuit board 3, protection is provided not to apply solder to the resistor body 4 housed in the through-hole 7, and a resistance characteristic is not affected.

The second electrode 6 of the shunt resistor 2 illustrated in FIG. 3B has a diameter that is slightly larger than the diameter of the resistor body 4 in contrast to FIG. 3A, but has a diameter that is smaller than the diameter of the first electrode 5. For example, the diameter of the second electrode 6 illustrated in FIG. 3B is roughly the same as the diameter of the through-hole 7. By doing this, the shunt resistor 2 can be inserted into the through-hole 7 from a side of the second electrode 6. In FIG. 3B, in a state where the shunt resistor 2 has been inserted into the through-hole 7, part of the second electrode 6 is located in the through-hole 7 of the circuit board 3. The second electrode 6 eliminates a gap between the second electrode 6 and the through-hole 7, effectively prevents the solder layer 20 from entering the gap, and can appropriately establish conductive connection between the second electrode 6 and the reverse-surface conductive part 11 with the solder layer 20 interposed therebetween.

Circuit Board 3

As illustrated in FIGS. 1A, 1B, and 2, in the circuit board 3, a plurality of through-holes 7 that can house the resistor body 4 of the shunt resistor 2 and a plurality of voltage detection terminals 8a and 8b have been formed. The circuit board 3 is, for example, a printed circuit board, and various not-illustrated electronic components, in addition to the shunt resistors 2, are mounted on the front surface 3a or the reverse surface 3b of the circuit board 3.

In the embodiment illustrated in FIGS. 1A and 1B, four shunt resistors 2 are supported by the circuit board 3, and therefore four through-holes 7 are formed in the circuit board 3. Each of the through-holes 7 is formed from the front surface (a first surface) 3a of the circuit board 3 to the reverse surface (a second surface) 3b that faces the front surface 3a. As illustrated in FIG. 2, it is preferable that the front surface 3a and the reverse surface 3b be surfaces that are parallel to an XY-plane.

On the front surface 3a of the circuit board 3, the front-surface conductive part 10 illustrated in FIG. 3A has been installed, and on the reverse surface 3b of the circuit board 3, the reverse-surface conductive part 11 illustrated in FIG. 3A has been installed. The front-surface conductive part 10 is connected to a conductive installation part 12 that electrically connects an external wiring member 14 such as a bus bar (see FIG. 2), and the front-surface conductive part 10 is covered with an insulating layer 21, excluding a peripheral area of the through-hole 7 that is soldered together with the first electrode 5. The reverse-surface conductive part 11 is also covered with the insulating layer, excluding a portion where the reverse-surface conductive part 11 and the second electrode 6 are made conductive, and other portions.

As illustrated in FIG. 2, in a state where each of the shunt resistors 2 has been inserted into each of the through-holes 7 of the circuit board 3, and the resistor body 4 is housed in the through-hole 7, the electrodes 5 and 6 of each of the shunt resistors 2 are respectively soldered to the front-surface conductive part 10 and the reverse-surface conductive part 11, and are electrically connected to the front-surface conductive part 10 and the reverse-surface conductive part 11 (see FIGS. 3A and 3B).

As illustrated in FIG. 1A, the conductive installation part 12 has been formed in a position apart from the through-holes 7. In the conductive installation part 12, for example, a fixing hole 12*a* that penetrates the circuit board 3 has been formed. As illustrated in FIG. 2, the external wiring member 14 such as a bus bar is installed on the conductive installation part 12, and the fixing member 15 such as a screw is made to pass through the fixing hole 12*a*, and therefore the external wiring member 14 can be appropriately fixed and supported on the circuit board 3. A current that flows through the external wiring member 14 to the circuit board 3 flows through a current route of the front-surface conductive part 10—the shunt resistor 2—the reverse-surface conductive part 11.

As illustrated in FIGS. 1A and 1B, in the circuit board 3, two voltage detection terminals 8*a* and 8*b* have been formed. These voltage detection terminals 8*a* and 8*b* have, for example, a configuration in which a conductive layer has been formed on an inner wall surface of a through-hole that has been formed from the front surface 3*a* to the reverse surface 3*b* of the circuit board 3. A first voltage detection terminal 8*a* is electrically connected to the front-surface conductive part 10, but is not electrically connected to the reverse-surface conductive part 11. As illustrated in FIG. 1B, the reverse-surface conductive part 11 and the first voltage detection terminal 8*a* are electrically cut off. On the other hand, a second voltage detection terminal 8*b* is electrically connected to the reverse-surface conductive part 11, but is not electrically connected to the front-surface conductive part 10.

As illustrated in FIG. 1A, signal lines 16 and 17 are respectively led out from the respective voltage detection terminals 8*a* and 8*b* along an inner layer surface of the circuit board 3, and, for example, these signal lines 16 and 17 are electrically connected to a first external connection terminal 23 and a second external connection terminal 24 on a side of the reverse surface 3*b* of the circuit board 3. As illustrated in FIG. 1B, on the reverse surface 3*b* of the circuit board 3, a GND terminal 25 is installed in addition to the first external connection terminal 23 and the second external connection terminal 24. Note that the first external connection terminal 23, the second external connection terminal 24, and the GND terminal 25 may be formed on the front surface 3*a* of the circuit board 3, or may be separately formed on the front surface 3*a* and the reverse surface 3*b* of the circuit board 3.

The first external connection terminal 23 and the second external connection terminal 24 are connected to a not-illustrated ammeter, and a voltage value between the first external connection terminal 23 and the second external connection terminal 24, that is, a voltage value between the electrodes 5 and 6 of the shunt resistor 2, is measured. In the present embodiment, a combined voltage value of four shunt resistors 2 can be measured. In this case, a resistance value of the resistor body 4 of the shunt resistor 2 is known, and therefore a current value can be detected according to the Ohm's law. As described above, the shunt resistor module 1 illustrated in FIG. 1 can be used as a current detection device.

As illustrated in FIG. 3A or the like, in the present embodiment, the resistor body 4 of the shunt resistor 2 that is applied to the shunt resistor module 1 has a columnar shape. Therefore, size can be reduced, and a large cross-sectional area can be secured in comparison with a configuration having a flat plate shape. A large current can be handled without an increase in an area of installation in the circuit board 3. In addition, in the present embodiment, the resistor body 4 having a columnar shape is housed in the through-hole 7 of the circuit board 3. Therefore, the height of the shunt resistor module 1 can be reduced. Moreover, in the present embodiment, a plurality of resistor bodies 4 having a columnar shape is used, and therefore a resistance value can be further reduced, and a large current can be handled more effectively.

Disposition of Voltage Detection Terminals 8*a* and 8*b*

In the present embodiment, disposition of the voltage detection terminals 8*a* and 8*b* is well designed to achieve a structure in which an influence of a magnetic flux generated at a time when current flows through the shunt resistor 2 is reduced to a minimum. An effect of canceling a magnetic flux is described with reference to the conceptual diagram of FIG. 4.

Figure 4:
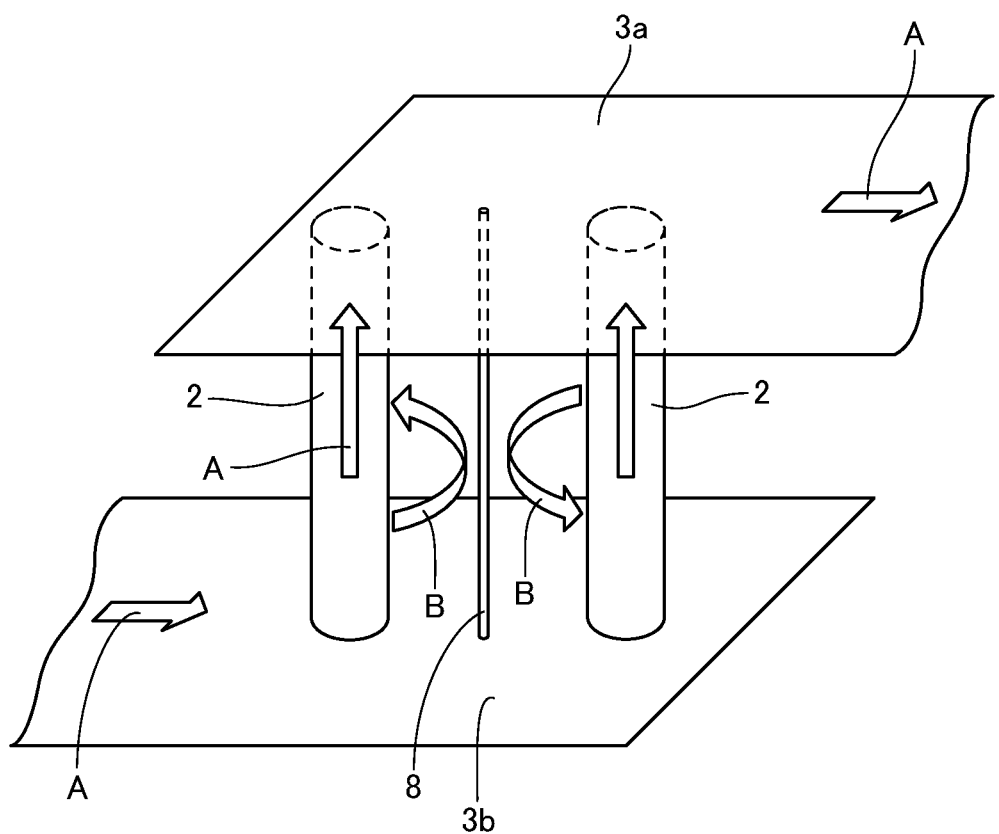
FIG. 4 is a conceptual diagram of a shunt resistor module for explaining an effect of canceling a magnetic flux.

In FIG. 4, two shunt resistors 2 are disposed between the front surface 3*a* and the reverse surface 3*b* of the circuit board 3 to be spaced apart from each other in a plan view. Note that, as described with reference to FIGS. 3A and 3B, each of the shunt resistors 2 is provided with the resistor body 4 having a columnar shape, and the electrodes 5 and 6 at the upper and lower ends of the resistor body 4, but this is omitted in FIG. 4. In FIG. 4, the shunt resistor 2 is illustrated in a bar shape, but in practice, the shunt resistor 2 has the structure illustrated in FIG. 3A or FIG. 3B. In FIG. 4, a current route A from the reverse surface 3*b* of the circuit board 3 through each of the shunt resistors 2 to the front surface 3*a* of the circuit board 3 is assumed. In this case, a magnetic flux (a magnetic field) B is generated around each of the shunt resistors 2 with each of the shunt resistors 2 as an axis according to the corkscrew rule. When the voltage detection terminal 8 is affected by the magnetic flux, a voltage value varies, and an accurate current value fails to be measured. Therefore, it is requested that an influence of the magnetic flux on the voltage detection terminal 8 be reduced to a minimum.

As illustrated as the current route A in FIG. 4, current flows through each of the shunt resistors 2 in the same direction, and therefore a magnetic flux is generated in the same direction around each of the shunt resistors 2. Therefore, in a position between the respective shunt resistors 2, directions of magnetic fluxes are opposite to each other, and the magnetic fluxes cancel each other. Therefore, as illustrated in FIG. 4, the voltage detection terminal 8 is disposed between two shunt resistors 2, and this enables a reduction in an influence of the magnetic flux B on the voltage detection terminal 8. It is preferable that the voltage detection terminal 8 be disposed at the center of the two shunt resistors 2, and therefore an effect of canceling the magnetic flux B is appropriately exhibited, and an influence of the magnetic flux on the voltage detection terminal 8 can be reduced more effectively.

In the present embodiment, as described in (3) described above, the respective voltage detection terminals 8*a* and 8*b* are collected near the center of gravity of the shunt resistors 2. Specific disposition of the respective voltage detection terminals 8*a* and 8*b* is described with reference to FIGS. 5 to 8.

Figure 5:
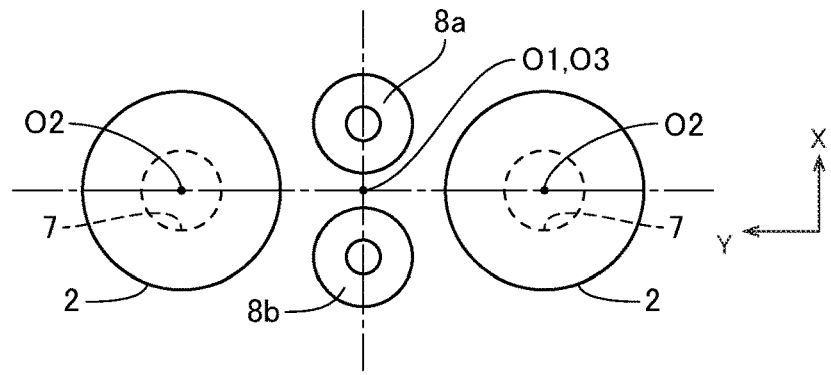
FIG. 5 is a partially enlarged plan view illustrating an example of disposition of two shunt resistors and voltage detection terminals.

FIG. 5 illustrates an example where the resistor body 4 (not illustrated) of the shunt resistor 2 is housed in each of two through-holes 7, and two shunt resistors 2 are disposed. As illustrated in FIG. 5, the respective shunt resistors 2 are disposed to be spaced apart from each other in a Y-direction. Here, the "center of gravity" includes both concepts of the physical center of gravity and the geometric center of gravity. The center of gravity O1 illustrated in FIG. 5 of the shunt resistors 2 indicates a position that is located at an equal distance from the centers O2 of the respective shunt resistors 2 in the Y-direction serving as a direction of disposition of the respective shunt resistors 2. In other words, the center of gravity O1 can be replaced with the center of gravity of the respective through-holes 7.

Then, as illustrated in FIG. 5, the two voltage detection terminals 8a and 8b are collected near the center of gravity O1 of the shunt resistors 2 in a plan view.

As illustrated in FIG. 5, the two voltage detection terminals 8a and 8b are disposed at an equal distance from the center of gravity O1 in an X-direction (a direction orthogonal to the Y-direction) with the center of gravity O1 therebetween. In other words, the center of gravity O3 of the voltage detection terminals 8a and 8b matches the center of gravity O1 of the shunt resistors 2.

Figure 6:
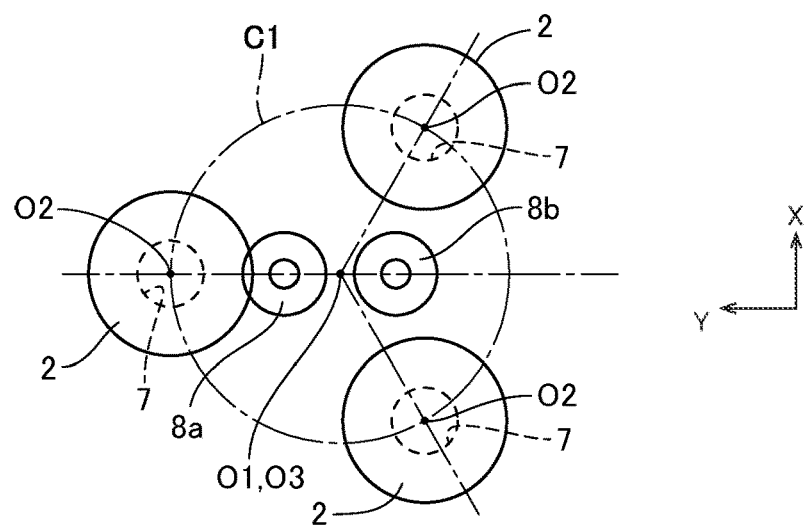
FIG. 6 is a partially enlarged plan view illustrating an example of disposition of three shunt resistors and voltage detection terminals.

FIG. 6 illustrates an example where the resistor body 4 (not illustrated) of the shunt resistor 2 is housed in each of three through-holes 7, and three shunt resistors 2 are disposed.

In FIG. 6, the centers O2 of the three shunt resistors 2 are disposed at intervals of 120 degrees on a concentric circle C1. Then, the two voltage detection terminals 8a and 8b are collected near the center of gravity O1 that is located at an equal distance from the centers O2 of the respective shunt resistors 2. The respective voltage detection terminals 8a and 8b are disposed at least in the concentric circle C1. As illustrated in FIG. 6, the two voltage detection terminals 8a and 8b are disposed at an equal distance from the center of gravity O1 in the Y-direction with the center of gravity O1 therebetween. In other words, the center of gravity O3 of the voltage detection terminals 8a and 8b matches the center of gravity O1 of the shunt resistors 2.

Figure 7:
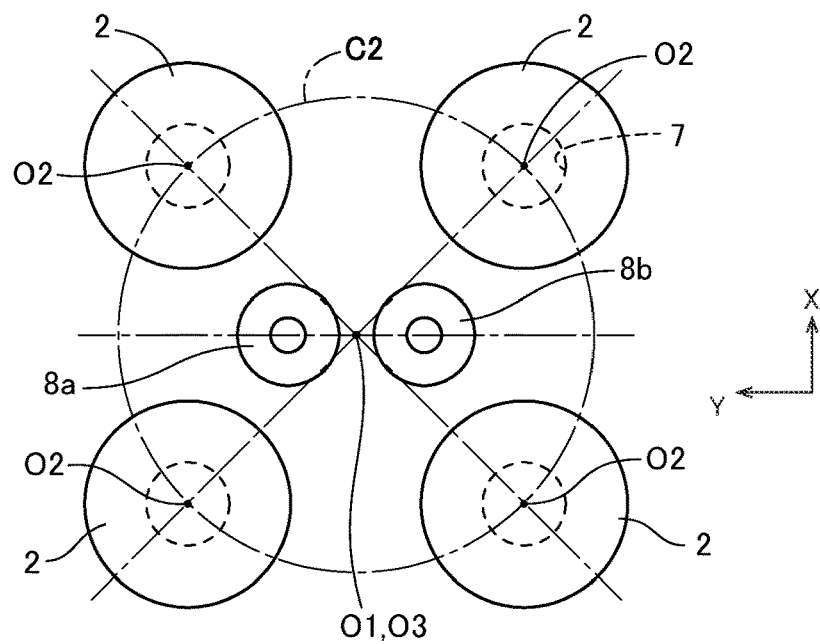
FIG. 7 is a partially enlarged plan view illustrating an example of disposition of four shunt resistors and voltage detection terminals.

FIG. 7 illustrates an example where the resistor body 4 (not illustrated) of the shunt resistor 2 is housed in each of four through-holes 7, and four shunt resistors 2 are disposed. In FIG. 7, the centers O2 of the four shunt resistors 2 are disposed at intervals of 90 degrees on a concentric circle C2.

In FIG. 7, the four shunt resistors 2 are disposed in a matrix in the X-direction and the Y-direction. Then, the two voltage detection terminals 8a and 8b are collected near the center of gravity O1 that is located at an equal distance from the centers O2 of the respective shunt resistors 2. The respective voltage detection terminals 8a and 8b are disposed at least in the concentric circle C2. As illustrated in FIG. 7, the two voltage detection terminals 8a and 8b are disposed at an equal distance from the center of gravity O1 in the Y-direction with the center of gravity O1 therebetween. In other words, the center of gravity O3 of the voltage detection terminals 8a and 8b matches the center of gravity O1 of the shunt resistors 2.

Figure 8:
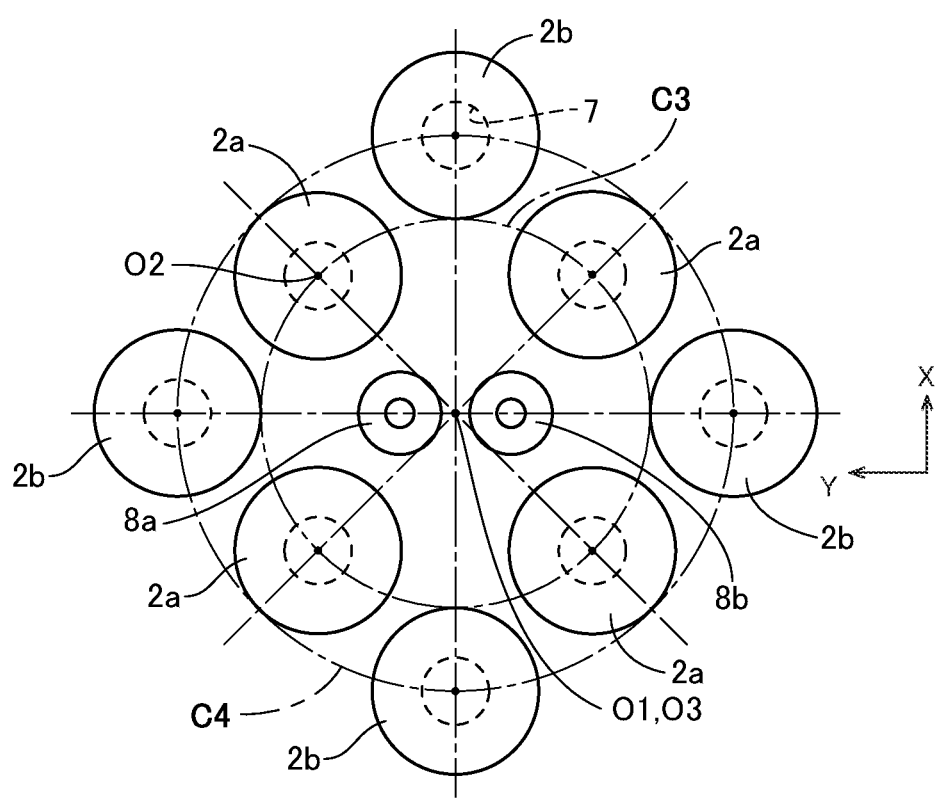
FIG. 8 is a partially enlarged plan view illustrating an example of disposition of eight shunt resistors and voltage detection terminals.

FIG. 8 illustrates an example where the resistor body 4 (not illustrated) of the shunt resistor 2 is housed in each of eight through-holes 7, and eight shunt resistors 2a and 2b are disposed.

In FIG. 8, the centers O2 of the four shunt resistors 2a are disposed at intervals of 90 degrees on a concentric circle C3, and are disposed in a matrix in the X-direction and Y-direction. Further, on the outside, the centers O2 of four remaining shunt resistors 2b are disposed at internals of 90 degrees on a concentric circle C4 having a diameter that is larger than a diameter of the concentric circle C3, and the shunt resistor 2a and the shunt resistor 2b are disposed to be shifted from each other by 45 degrees. The physical center of gravity of the eight shunt resistors 2 is the center of gravity O1, and two voltage detection terminals 8a and 8b are collected near the center of gravity O1. The respective voltage detection terminals 8a and 8b are disposed at least in the concentric circle C3. As illustrated in FIG. 8, the two voltage detection terminals 8a and 8b are disposed at an equal distance from the center of gravity O1 in the Y-direction with the center of gravity O1 therebetween. In other words, the center of gravity O3 of the voltage detection terminals 8a and 8b matches the center of gravity O1 of the shunt resistors 2.

In all of the disposition examples of FIGS. 5 to 8 described above, respective voltage detection terminals 8a and 8b are collected near the center of gravity O1 of shunt resistors 2, and this can effectively reduce an influence of a magnetic flux on the respective voltage detection terminals 8a and 8b.

In addition, as described above, the center of gravity O3 of the respective voltage detection terminals 8a and 8b is made to match the center of gravity O1 of the respective shunt resistors 2. This enables more effective improvements in an effect of canceling a magnetic flux, and current can be detected with high accuracy.

Positions of Taking Out of Signal Lines 16 and 17

In the present embodiment, in addition to improvements in disposition of the respective voltage detection terminals 8a and 8b, positions where respective signal lines 16 and 17 are taken out from the respective voltage detection terminals 8a and 8b are improved.

Figure 9A:
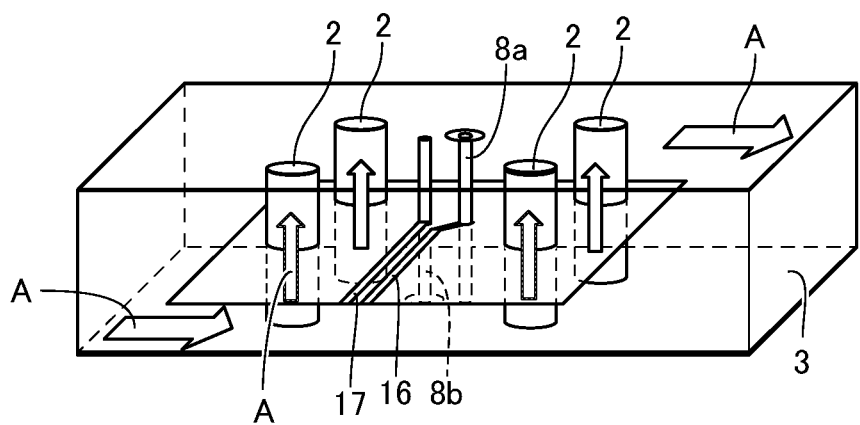
FIG. 9A is a conceptual diagram (a perspective view) of a shunt resistor module for explaining positions where signal lines are taken out from voltage detection terminals.
Figure 9B:
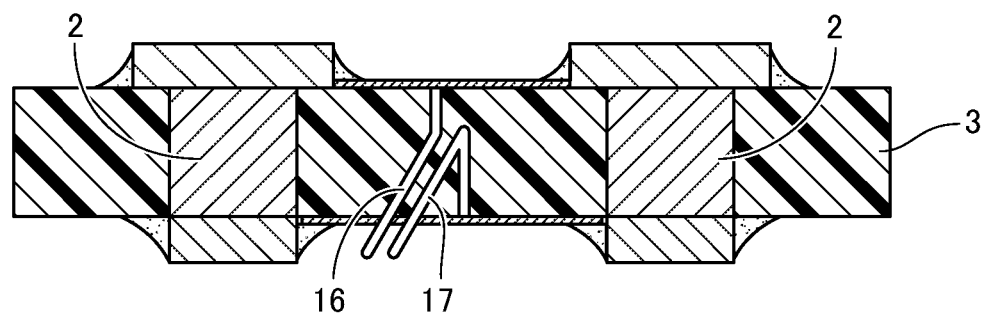
FIG. 9B is a schematic sectional view of FIG. 9A.

FIG. 9A is a conceptual diagram (a perspective view) of a shunt resistor module for explaining the disposition of signal lines to be led out from voltage detection terminals, and FIG. 9B is a schematic sectional view of FIG. 9A.

As illustrated in FIGS. 9A and 9B, the signal lines 16 and 17 to be led out from the respective voltage detection terminals 8a and 8b are taken out from the same height in a thickness direction of the circuit board 3. In the present embodiment, it is preferable that the respective signal lines 16 and 17 always be taken out from the same height. By leading out the respective signal lines 16 and 17 from the same height, the intensity of a magnetic flux received by a signal line from the voltage detection terminal 8a to the signal line 16 can be made closer to the intensity of a magnetic flux received by a signal line from the voltage detection terminal 8b to the signal line 17, and an effect of canceling a magnetic flux can be maximally utilized. In addition, by leading out the respective signal lines 16 and 17 with a reduction in an influence of a generated magnetic flux, a difference in a magnetic flux can be reduced more effectively. Thus, current can be detected with higher accuracy.

Figure 10A:
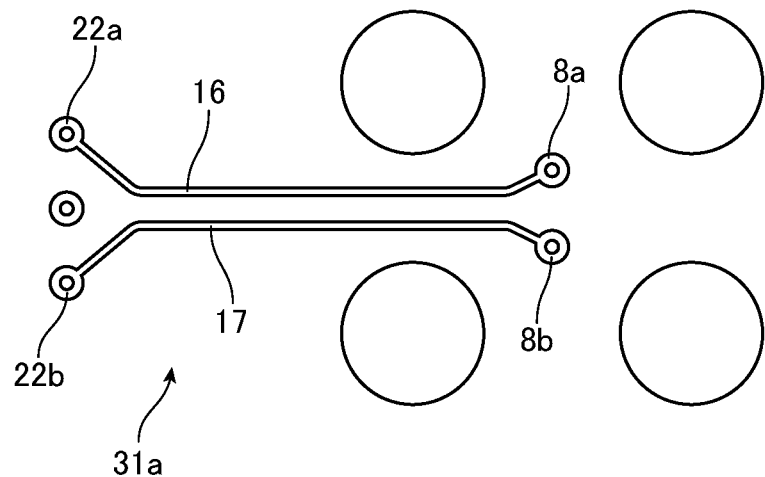
FIG. 10A is an inner layer face view illustrating an example of leading out signal lines.

A specific configuration relating to leading out of the respective signal lines 16 and 17 and the GND line 19 is described with reference to FIGS. 10A and 10C. FIG. 10A is an inner layer face view illustrating an example of leading out signal lines, FIG. 10B is an inner layer face view illustrating an example of leading out a GND line, and FIG. 10C is a schematic sectional view of a laminated circuit board.

Figure 10B:
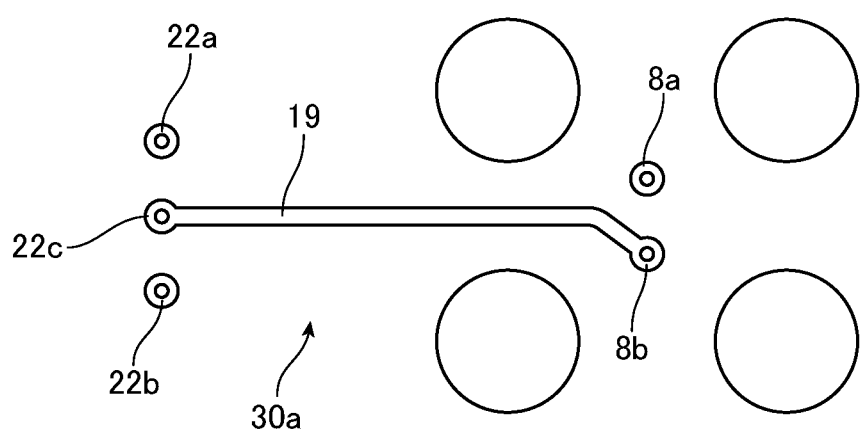
FIG. 10B is an inner layer face view illustrating an example of leading out a GND line.
Figure 10C:
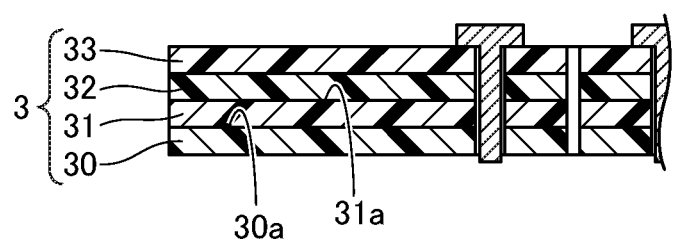
FIG. 10C is a schematic sectional view of a laminated circuit board.

As illustrated in FIG. 10C, the circuit board 3 is a laminated circuit board obtained by laminating a plurality of layers 30 to 33. The signal lines 16 and 17 to be led out from the respective voltage detection terminals 8a and 8b are disposed, for example, on the same center inner layer face 31a between the layer 31 and the layer 32 that are illustrated in FIG. 10C. As described above, the signal lines 16 and 17 are taken out from the same height. In the present embodiment, the center inner layer face 31a is located at the center of the thickness of the circuit board 3. As illustrated in FIG. 10A, the signal lines 16 and 17 are led out from the respective voltage detection terminals 8a and 8b to through-hole conductive parts 22a and 22b that are connected to the external connection terminals 23 and 24 (see FIG. 1B) on the center inner layer face 31a. As illustrated in FIGS. 10A and 10B, the respective signal lines 16 and 17 are formed in a pattern that is thinner than a pattern of the GND line 19 and is as thin as possible.

In addition, the GND line 19 illustrated in FIG. 10B can be formed on an inner layer face other than the center inner layer face 31a, and is formed, for example, on an inner layer face 30a between the layer 30 and the layer 31. As illustrated in FIG. 10B, the GND line 19 is led out from the voltage detection terminal 8b to a through-hole conductive part 22C that is connected to the GND terminal 25 (see FIG. 1B).

Figure 11:
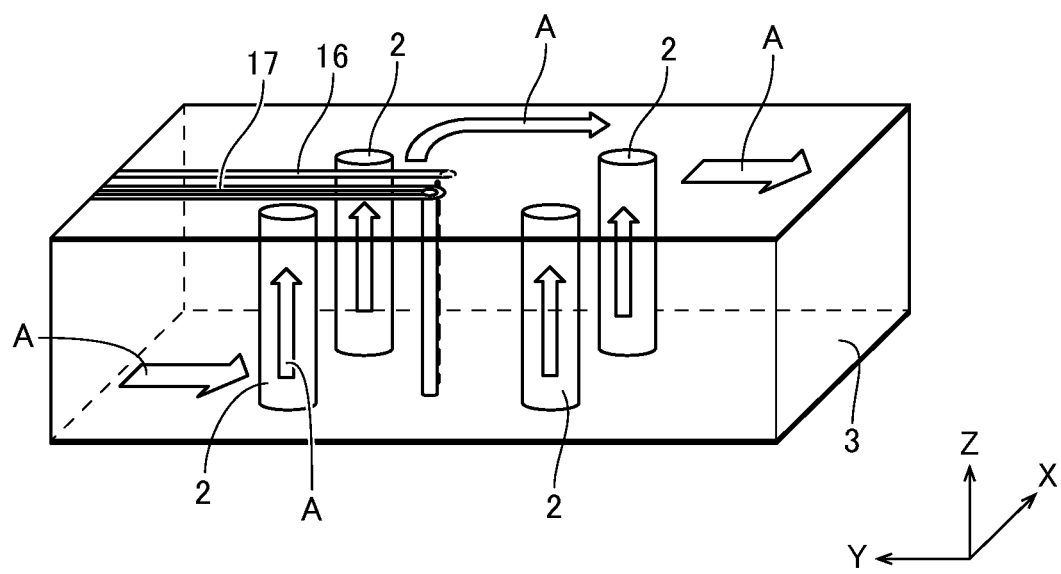
FIG. 11 is a conceptual diagram of a shunt resistor module illustrating a variation in which signal lines have been taken out from a front surface of a circuit board.

In FIGS. 9A, 9B, and 10A to 10C, the respective signal lines 16 and 17 are led out from the same inner layer face in the circuit board 3. However, for example, as illustrated in FIG. 11, the respective signal lines 16 and 17 can be taken out, for example, along the front surface 3a of the circuit board 3. However, for example, if the signal lines 16 and 17 are led out in a direction (the X-direction) that is perpendicular to the current route A, the current route A is obstructed. Therefore, it is preferable that a direction of leading out the respective signal lines 16 and 17 be the same as a direction of the current route A (in FIG. 11, the Y-direction).

Shunt Resistor Module According to Second Embodiment

In the shunt resistor module 1 according to the first embodiment described above, a plurality of voltage detection terminals 8a and 8b is disposed to be spaced apart from each other in a plan view. In this case, the respective voltage detection terminals 8a and 8b have been collected near the center of gravity O1 of shunt resistors 2 in order to make it difficult for the voltage detection terminals 8a and 8b to receive an influence of a magnetic flux.

Figure 12:
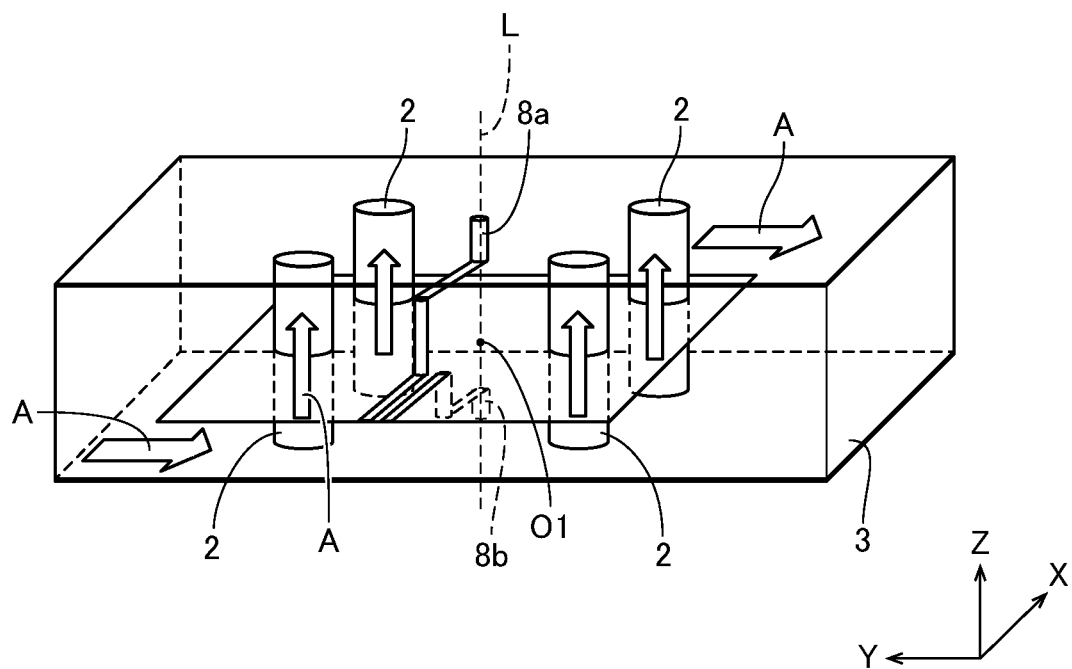
FIG. 12 is a conceptual perspective view of a shunt resistor module according to a second embodiment.

In contrast, in a second embodiment, as illustrated in FIG. 12, the first voltage detection terminal 8a, the second voltage detection terminal 8b, and the center of gravity O1 of shunt resistors 2 are located on the same straight line L along a thickness direction (a Z-direction) of the circuit board 3. Such a configuration can be achieved by using a build-up wiring board as the circuit board 3. As described above, by disposing the first voltage detection terminal 8a, the second voltage detection terminal 8b, and the center of gravity O1 of the shunt resistors 2 in the same position in the height direction (the Z-direction), the first voltage detection terminal 8a and the second voltage detection terminal 8b can be disposed in a center position that can cancel a magnetic flux most, and current can be detected with higher accuracy.

Shunt Resistor Module According to Third Embodiment

Figure 13:
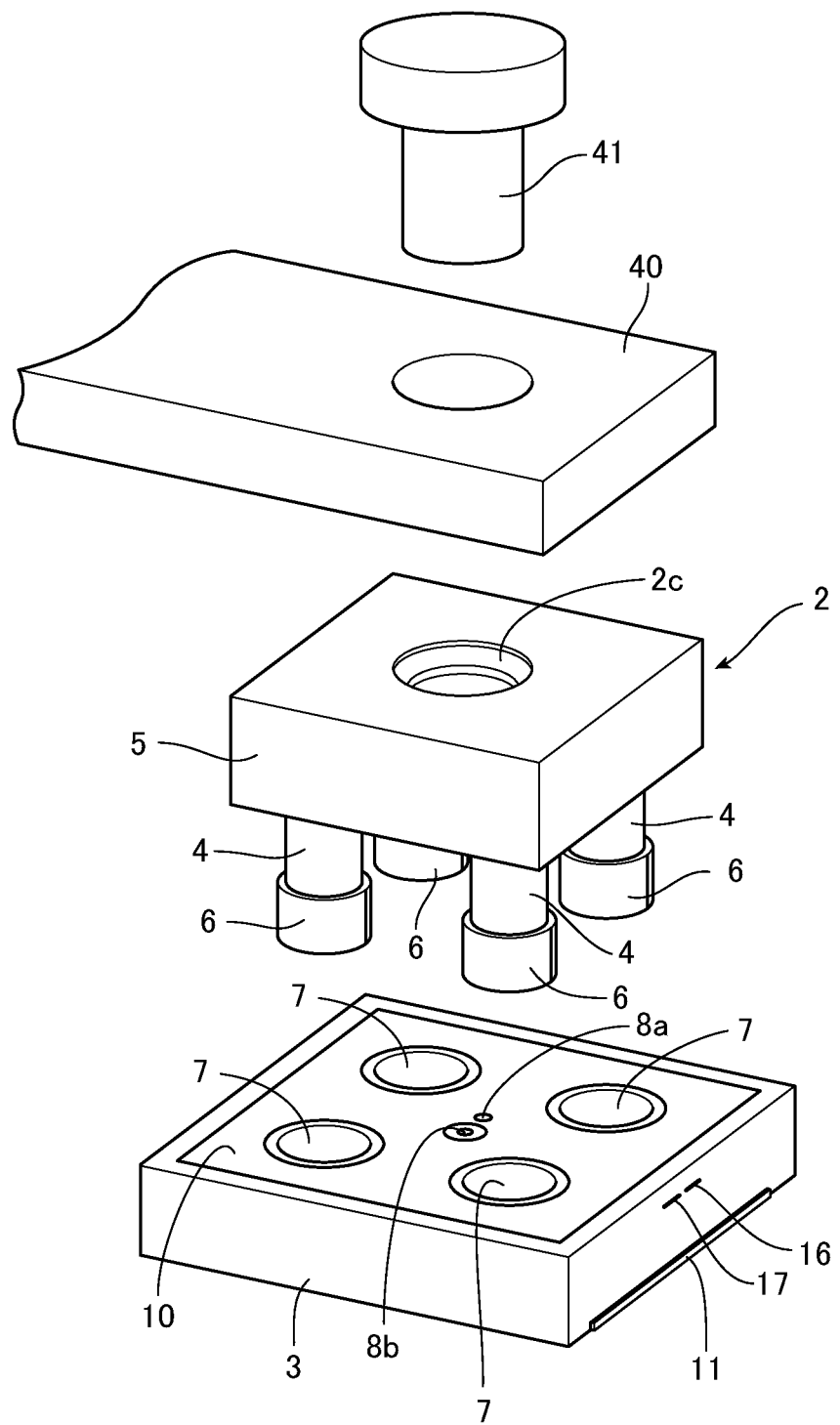
FIG. 13 is an exploded perspective view of a shunt resistor module according to a third embodiment.
Figure 14A:
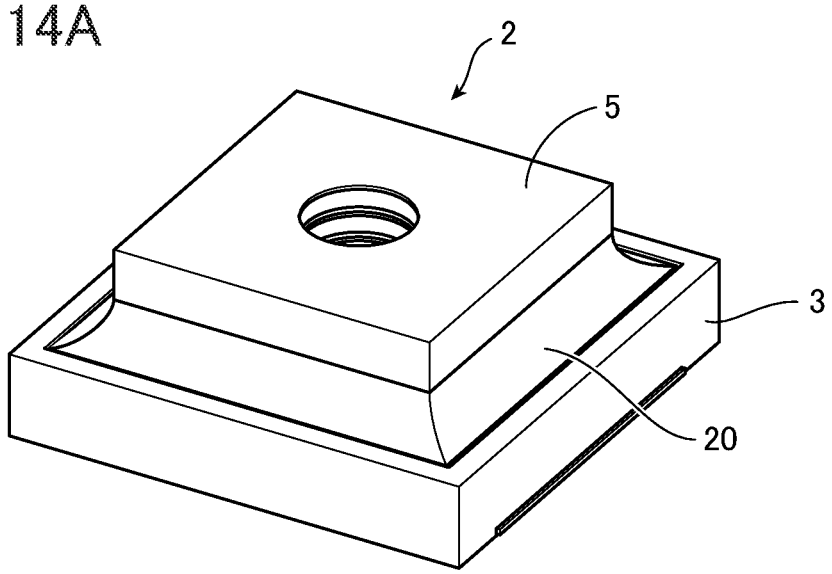
FIG. 14A is a perspective front surface view of the shunt resistor module according to the third embodiment.
Figure 14B:
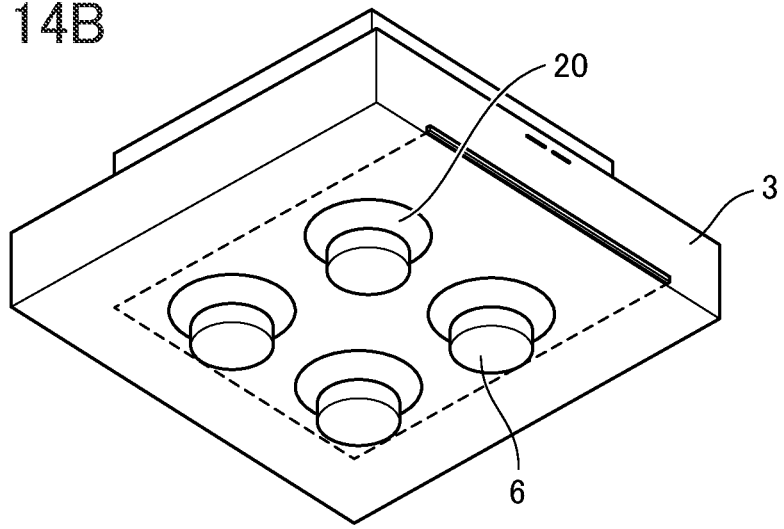
FIG. 14B is a perspective reverse surface view of the shunt resistor module according to the third embodiment.
Figure 15:
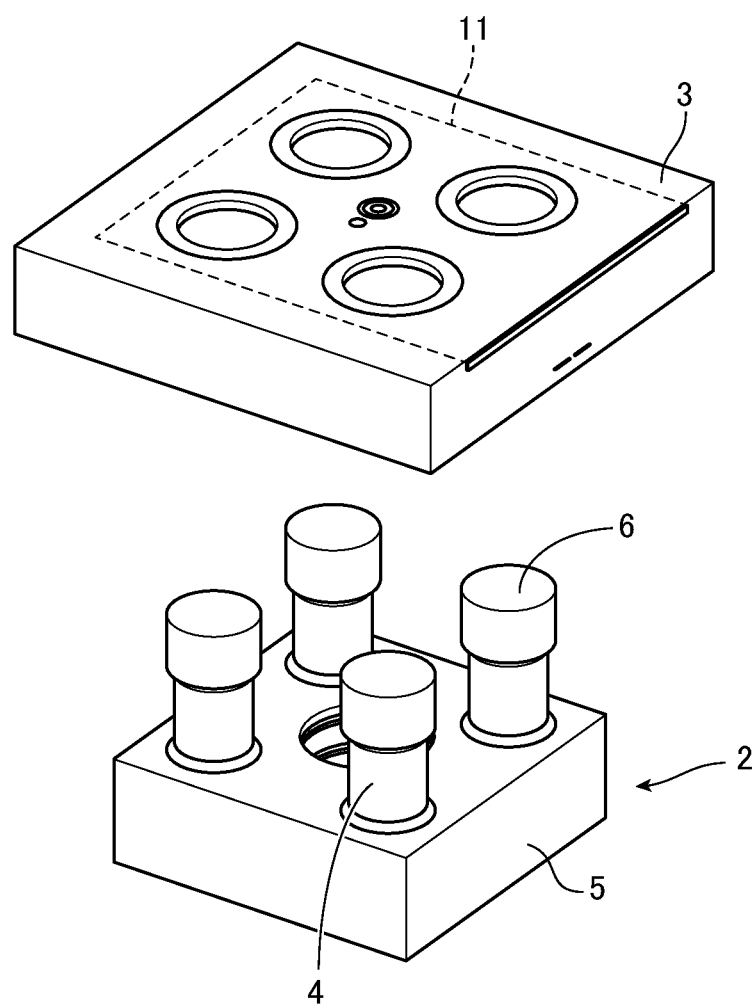
FIG. 15 is an exploded perspective view of the shunt resistor module according to the third embodiment when viewed from a reverse surface.

FIG. 13 is an exploded perspective view of a shunt resistor module according to a third embodiment. FIG. 14A is a perspective front surface view of the shunt resistor module according to the third embodiment, and FIG. 14B is a perspective reverse surface view. FIG. 15 is an exploded perspective view of the shunt resistor module according to the third embodiment when viewed from a reverse surface.

As illustrated in FIG. 13, upper ends of a plurality of resistor bodies 4 having a columnar shape are connected to a common first electrode 5. On the other hand, a second electrode 6 is provided at lower ends of the respective resistor bodies 4. As described above, in FIG. 13, an integrated shunt resistor 2 in which the plurality of resistor bodies 4 is fixed to the common first electrode 5 is configured. At the center of the first electrode of the shunt resistor, a fixing hole 2c that fixes a bus bar 40 by using a fixing member 41 has been formed. Note that this fixing hole 2c is formed up to the middle of the first electrode 5, and does not penetrate the first electrode 5.

As illustrated in FIG. 13, the same number of through-holes 7 as the number of the resistor bodies 4 have been formed in the circuit board 3. Each of the through-holes 7 has been formed to have a diameter that is roughly the same as a diameter of the second electrode 6 or a diameter that is larger than the diameter of the second electrode 6. In the present embodiment, the diameter of the through-hole 7 is roughly the same as the diameter of the second electrode 6.

As illustrated in FIG. 13, at the center of the circuit board 3, a plurality of voltage detection terminals 8a and 8b has been formed. The preferable disposition of the voltage detection terminals 8a and 8b has been described with reference to FIG. 7. On a front surface of the circuit board 3, a front-surface conductive part 10 has been pattern-formed. When the shunt resistor 2 has been installed, the front-surface conductive part 10 abuts onto the first electrode 5 of the shunt resistor 2. In addition, as illustrated in FIG. 15, on a reverse surface of the circuit board 3, a reverse-surface conductive part 11 has been formed. Note that the reverse-surface conductive part 11 is covered with an insulating layer such as resist, excluding a portion of connection to the second electrode 6. In addition, as illustrated in FIG. 13, on a side surface of the circuit board 3, the signal lines 16 and 17 have been led out from the respective voltage detection terminals 8a and 8b.

Note that in FIG. 13, only a portion where the shunt resistor 2 is mounted of the circuit board 3 is illustrated. However, in practice, the circuit board 3 has a larger area, and various not-illustrated electronic components have been mounted.

Respective resistor bodies 4 and respective second electrodes 6 of the shunt resistor 2 illustrated in FIG. 13 are inserted into the respective through-holes 7, and the shunt resistor 2 is installed on the front surface of the circuit board 3. Further, solder is applied between the first electrode 5 and the front-surface conductive part 10 and between the second electrode 6 and the reverse-surface conductive part 11, and therefore the shunt resistor module illustrated in FIGS. 14A and 14B is completed. Reference sign 20 illustrated in FIGS. 14A and 14B indicates a solder layer.

In addition, embodiments of the present invention and variations have been described. However, other embodiments may be made by combining all or some of the embodiments and the variations that have been described above.

Further, embodiments of the present invention are not limited to the embodiments and the variations that have been described above, and various changes, substitutions, and alterations may be made without departing from the spirit of technical ideas. Moreover, if the technical ideas can be achieved in another manner due to technological progress or by using another derivative technology, the technical ideas may be embodied by using such a method. Accordingly, the claims cover all of the embodiments that can be included in the scope of the technical ideas.

The outline of characteristic points in the embodiments described above is described below.

A shunt resistor module according to the embodiment described above includes: a shunt resistor that includes a plurality of resistor bodies having a columnar shape, and electrodes that are located at both ends of each of the plurality of resistor bodies; and a circuit board that includes a plurality of through-holes that can house the plurality of resistor bodies, and a plurality of voltage detection terminals that detects a voltage between the electrodes of the shunt resistor that has been inserted into the plurality of through-holes, and each of the plurality of voltage detection terminals is collected near a center of gravity of the shunt resistor.

In addition, in the shunt resistor module according to the present embodiment, it is preferable that the center of gravity of the shunt resistor match a center of gravity of the plurality of voltage detection terminals.

Further, in the shunt resistor module according to the present embodiment, it is preferable that a signal line be led out from each of the plurality of voltage detection terminals in an identical height position.

Furthermore, in the shunt resistor module according to the present embodiment, it is preferable that the center of gravity of the shunt resistor and each of the plurality of voltage detection terminals be located on an identical line in a height direction of the circuit board.

INDUSTRIAL APPLICABILITY

As described above, a shunt resistor module according to the present invention is reduced in size, can handle a large current, and can accurately detect current. The shunt resistor module can be applied, for example, to detection of a current for controlling a power semiconductor device or the like, or management of energy of a battery.

The present application is based on Japanese Patent Application No. 2019-187875, filed on Oct. 11, 2019. The entire contents thereof are incorporated herein by reference.

The invention claimed is:

1. A shunt resistor module comprising:
a planar rectangular body comprising:
   a shunt resistor that includes a plurality of resistor bodies having a columnar shape, and electrodes that are located at both ends of each of the plurality of resistor bodies; and
   a circuit board that includes a plurality of through-holes that can house the plurality of resistor bodies, and a plurality of voltage detection terminals that detects a voltage between the electrodes of the shunt resistor that has been inserted into the plurality of through-holes, wherein
   each of the plurality of voltage detection terminals is collected near a center of gravity of the shunt resistor.

2. The shunt resistor module according to claim 1, wherein the center of gravity of the shunt resistor matches a center of gravity of the plurality of voltage detection terminals.

3. The shunt resistor module according to claim 1, wherein a signal line is led out from each of the plurality of voltage detection terminals in an identical height position.

4. The shunt resistor module according to claim 1, wherein the center of gravity of the shunt resistor and each of the plurality of voltage detection terminals are located on an identical line in a height direction of the circuit board.

5. The shunt resistor module according to claim 1, wherein the plurality of resistor bodies extend orthogonally to an outer surface of the planar rectangular body.

\* \* \* \* \*